(12) United States Patent
Shinogi et al.

(10) Patent No.: US 6,326,701 B1
(45) Date of Patent: Dec. 4, 2001

(54) CHIP SIZE PACKAGE AND MANUFACTURING METHOD THEREOF

(75) Inventors: Hiroyuki Shinogi; Nobuyuki Takai; Ryoji Tokushige; Yukihiro Takao; Katsuhiko Kitagawa, all of Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/512,481

(22) Filed: Feb. 23, 2000

(30) Foreign Application Priority Data

Feb. 24, 1999 (JP) ................................. 11-046736
Feb. 24, 1999 (JP) ................................. 11-046740

(51) Int. Cl.$^7$ ................................................. H01L 21/76
(52) U.S. Cl. ........................................ 257/797; 257/620
(58) Field of Search ................................. 257/797, 737, 257/738, 778, 780, 774, 750, 758, 761, 762, 763, 764, 765, 766, 620

(56) References Cited

U.S. PATENT DOCUMENTS

| | | | |
|---|---|---|---|
| 5,886,415 | * 3/1999 | Akawa | 257/789 |
| 5,889,333 | * 3/1999 | Takenaka et al. | 257/783 |
| 5,892,273 | * 4/1999 | Iwasaki et al. | 257/690 |
| 5,949,142 | * 9/1999 | Otsuka | 257/737 |
| 6,051,450 | * 4/2000 | Ohsawa et al. | 438/123 |
| 6,075,290 | * 6/2000 | Schaefer et al. | 257/737 |
| 6,111,309 | * 8/2000 | Yoshino | 257/678 |
| 6,130,480 | * 10/2000 | Ohuchi et al. | 257/738 |

FOREIGN PATENT DOCUMENTS

| 09/64049 | 9/1997 | (JP) . |
|---|---|---|
| A-09-64049 | 9/1997 | (JP) . |

\* cited by examiner

*Primary Examiner*—Eddie Lee
*Assistant Examiner*—Lourdes Cruz
(74) *Attorney, Agent, or Firm*—Fish & Richardson P.C.

(57) ABSTRACT

A removal area EL is provided as a first dicing line in a dicing area, coat materials 6' and 7' are put on the flanks of the removal area, a resin layer R is formed, and a dicing blade narrower than the width of the removal area EL is used to fully cut on a second dicing line, whereby the interface exposed by the first dicing can be coated and protected.

9 Claims, 8 Drawing Sheets

CHIP SIZE PACKAGE AND MANUFACTURING METHOD THEREOF

BACKGROUND OF THE INVENTION

1. Field of the Invention

This invention relates to a chip size package and a manufacturing method thereof and in particular to improvement in the resistance of the chip size package to moisture.

2. Description of the Related Art

In the case of manufacturing semiconductor devices, elements are built sequentially in a wafer to form IC circuits each having a predetermined function, as well known. In two dimensions, IC circuit formation parts where the IC circuits are formed are placed like a matrix, dicing line parts are provided like a lattice surrounding the IC circuit formation parts, and the IC circuit formation parts are diced along the dicing line parts to form separate semiconductor devices (semiconductor chips). Then, often each semiconductor device (semiconductor chip) is mounted on connection materials of a lead frame, a film carrier, etc., and is sealed with a resin.

However, in recent years, attention has been focused on a method wherein connection materials are formed and sealing is executed before dicing for miniaturization and simplifying packaging. A chip size package (CSP) is available.

The CSP is also described in JP-A-9-64049, for example. FIG. 9 gives an outline of a chip size package 50 disclosed in JP-A-9-64049. A wafer 51 is formed with a desired element area, then is covered on a surface with a passivation film 51P. An opening is made for exposing each metal electrode 52 (for example, a bonding pad) on the top layer and a rewiring layer 53 is formed by a Cu plating method so as to come in contact with the metal electrode 52 via the opening.

A metal post 55 is formed on the surface of the rewiring layer 53, the full face is coated with a seal resin 56, and the metal post 55 exposed from the seal resin 56 is formed with a solder bump or a solder ball 57.

In this state, dicing is performed along dicing line parts 59 to separate the wafer 51 into complete semiconductor chips 50.

However, the interfaces each between interlayer insulating films deposited in the semiconductor device are exposed to the flanks of the dicing lines. The interfaces become entry passages of moisture, causing malfunction of the IC circuit and destruction of the IC circuit.

Particularly, a number of interlayer insulating films such as a first interlayer insulating film, a second interlayer insulating film, a third interlayer insulating film are provided depending on the number of layers of metal wiring and moreover each interlayer insulating film is formed by repeatedly depositing films each consisting of a plurality of layers, such as TEOS films or SOG films, considering distortion and flatness. The interfaces each between the films are exposed to the flanks formed in the dicing line parts, causing moisture resistance to be degraded.

A structure wherein the CSP of the rewiring type has a surface coated with a seal resin is also available. It is called seal resin type and is a structure with a surface coated with a seal resin, like that of a conventional package, wherein a metal post is formed on a wiring layer on the chip surface and is surrounded by seal resin for fixture.

Generally, it is said that if a package is mounted on a printed wiring board, a stress generated because of the thermal expansion difference between the package and the printed wiring board concentrates on a metal post; however, in the wafer CSP of the seal resin type, it is considered that the stress is scattered because the metal post lengthens.

The seal resin type provides high reliability by lengthening the metal post about 100 μm and reinforcing the metal post with a seal resin. However, the seal resin foration process needs to be executed using a metal mold at a later step, leading to a complicated process.

On the other hand, the rewiring type has the advantages that the process is comparatively simple and moreover most steps can be executed in the wafer process. However, the stress needs to be relieved for enhancing the reliability by some method.

FIG. 11 is a drawing provided by omitting the wiring layer 53 in FIG. 10. Al electrode 52 forms an exposed opening formed with at least one layer of barrier metal 58 between the metal post 55 and the Al electrode 52, and the solder ball 57 is formed on the metal post 55.

However, in FIG. 10, the insulating film of the lower layer of the wiring layer 53 is formed subtanially by tracing the asperities on the film of the lower layer intact, thus the wiring layer 53 formed on the whole chip area is formed like the shape reflecting the asperities. Therefore, if the heights of the metal posts 55 are constant, asperities are formed on the full face of the wafer, thus the heights from the rear face of the semiconductor substrate to the metal posts 55 vary.

The semiconductor devices comprising the metal posts thus formed are soldered onto a mount board, such as a print circuit board or a ceramic circuit board. However, since the heights from the semiconductor substrates vary, some semiconductor devices have solder balls electrically connected to the conductive pattern of the mount board, and some don't.

Further, the wafer rear face may be shaved from the trend of miniaturization, in which case the wafer is extremely thin.

Thus, if the wafer is placed on metal mold described with reference to FIGS. 12 and 13, it is broken.

As shown in FIG. 12, after the semiconductor wafer is placed, resin 63 is entered in metal mold 60, 61, 62 and ifs pressurized and fused. Semiconductor chips 51 are placed in the metal mold in a state in which a large number of metal posts 55 are upright, and the resin 63 is pressed by the metal mold and the wafer full face is covered with the resin 63. Numeral 64 denotes a sheet for peeling off from the metal mold.

However, if the metal post heads are all pressed so as to abut the metal mold and the sheet 64, distortion is applied to the wafer, which is then broken. Particularly, dust (metal particles several μm to several ten μm in diameter) may exist on the rear face of the wafer, in which case the wafer is pressed with the metal particles as the supporting points and thus is broken more easily.

Therefore, it is desired to flatten the surface of the wafer.

SUMMARY OF THE INVENTION

It is therefore an object of the invention to provide a CSP improved in moisture resistance and high in reliability.

It is another object of the invention to provide a CSP high in reliability by flattening the surface of a semiconductor chip.

According to a first aspect of the invention, there is provided a semiconductor device of a chip size package (CSP) structure wherein an element area is formed on a surface of a semiconductor substrate, a wiring part is formed on the element area, and the outer periphery of the semiconductor substrate and that of the package are made almost equal, characterized in that a recess (removal area) from a surface of the semiconductor device to the semiconductor substrate is made on the outer peripheral surface of the semiconductor device and that a seal material is disposed so as to cover the interface between each two layers included in the semiconductor substrate and the wiring part covering the surface of the semiconductor substrate, exposed to the recess.

A step-like removal area is provided in the surroundings of the chip and the interface exposed to the removal area is covered with both or either of metal post and rewiring layer formation materials. Therefore, the coat material functions as a seal ring and moisture resistance can be improved.

That is, according to the first aspect of the invention, there is provided a semiconductor device of a chip size package (CSP) structure wherein an element area is formed on a surface of a semiconductor substrate, a wiring part is formed on the element area, and the outer periphery of the semiconductor substrate and that of the package are made almost equal, characterized in that recess from a surface of the semiconductor device to the semiconductor substrate is made on the outer peripheral surface of the semiconductor device and that a seal material is disposed so as to cover the interface between the semiconductor substrate and the wiring part covering the surface of the semiconductor substrate, exposed to the recess.

In a second aspect of the invention, in the semiconductor device in the first aspect of the invention, the wiring part has a surface coated with a resin and comprises an outer lead made of a solder ball or a solder bump so as to project from the resin surface and a metal post connected to the outer lead.

In a third aspect of the invention, in the semiconductor device in the first aspect of the invention, the seal material is one of the wiring materials forming the wiring part.

In a fourth aspect of the invention, in the semiconductor device in the first aspect of the invention, the seal material contains Cu.

In a fifth aspect of the invention, in the semiconductor device in the first aspect of the invention, the recess in the outer peripheral surface of the semiconductor device is coated with a resin.

In a sixth aspect of the invention, in the semiconductor device in the first aspect of the invention, an insulating layer which becomes the ground of a wiring layer of the wiring part is made of a fluid material, a surface of which has substantial flatness after the expiration of a predetermined time after the material is put.

In a seventh aspect of the invention, in the semiconductor device in the sixth aspect of the invention, the insulating layer is a film formed by a spin on method.

In an eighth aspect of the invention, in the semiconductor device in the seventh aspect of the invention, the insulating layer is formed to a film thickness completely covering the ground layer.

In a ninth aspect of the invention, in the semiconductor device in the eighth aspect of the invention, the ground layer is a passivation film.

In a method of the invention, a first insulating layer abutting a wiring layer is made of a fluid material, a surface of which has substantial flatness after the expiration of a predetermined time after the material is put on a wafer, and after the first insulating layer is flattened, the wiring layer is formed.

That is, according to a tenth aspect of the invention, there is provided a semiconductor device manufacturing method comprising:

the step of forming a first insulating layer on a surface of a semiconductor substrate where an element area is formed;

the step of forming a wiring layer so as to come in contact with a part of the element area via a first opening made in the first insulating layer;

the step of coating a wafer surface containing the first insulating layer and the wiring layer with a second insulting layer made of a resin;

the step of forming a conductive post-like body so as to expose from the first insulating layer via a second opening;

the step of forming a solder ball (or a solder bump) so as to come in contact with the conductive post-like body; and the dicing step of fully cutting the semiconductor substrate along dicing lines so as to provide a plurality of semiconductor devices, characterized in that the step of forming the first insulating layer includes the steps of:

putting a fluid material on the surface of the semiconductor substrate; and leaving the fluid material standing for a predetermined time for curing it and flattening the surface of the first insulting layer.

In an eleventh aspect of the invention, in the semiconductor device manufacturing method in the tenth aspect of the invention, the semiconductor device manufacturing method wherein the putting step is a spin on step.

In a twelfth aspect of the invention, in the semiconductor device manufacturing method in the tenth aspect of the invention, the second insulating layer made of a resin is made of a fluid material, a surface of which has substantial flatness after the expiration of a predetermined time after the material is put on the wafer by spin on.

In a thirteenth aspect of the invention, in the semiconductor device manufacturing method in the tenth aspect of the invention, the dicing step includes the steps of:

forming first dicing lines to a predetermined depth from the substrate surface, thereby forming recesses;

forming the second insulating layer so as to also reach the insides of the recesses; and then forming second dicing lines narrower than the first dicing lines as full cut lines in the areas corresponding to the recesses.

In a fourteenth aspect of the invention, in the semiconductor device manufacturing method in the tenth aspect of the invention, the dicing step includes the steps of:

before forming the wiring layer, forming first dicing lines to a predetermined depth from the substrate surface, thereby forming recesses;

forming the wiring layer so as to also extend to the insides of the recesses and further forming the second insulating layer so as to also reach the recesses covered with the first wiring layer; and then forming second dicing lines narrower than the first dicing lines as full cut lines in the areas corresponding to the recesses.

For example, the passivation film traces the asperities of the substrate surface. However, if the passivation film is coated with a pre-cured resin having a predetermined viscosity with a film thickness completely exceeding the top of the passivation film on the wafer surface, the surface can be flattened over the whole wafer area because the resin has fluidity. After this, the wiring layer is formed, whereby it is formed on the flat resin layer r after being cured. Thus, if a plurality of metal posts are formed on the semiconductor wafer, the heights from the rear face of the substrate to the metal post heads become all uniform.

The material of the resin layer r is formed by spin on.

The spin on is a technique often adopted in normal semiconductor device manufacturing methods and can be easily executed without providing additional facilities.

The second insulating layer made of a resin is made of a fluid material, the surface of which has substantial flatness after the expiration of a predetermined time after the material is put on the wafer by spin on.

As described above, the metal post head heights from the rear face of the wafer can be all made uniform, but the wafer may warp. However, is formed by spin on without adopting the metal mold method, spin on is used for forming the insulating layer made of the resin without adopting a metal mold method, thus press hardening becomes unnecessary and wafer cracks can be prevented.

Resin may be applied to the wafer using a dispenser in place of spin on.

DESCRIPTION OF THE PREFERRED EMBODIMENT

A first embodiment of the invention will be discussed.

Figure 5:
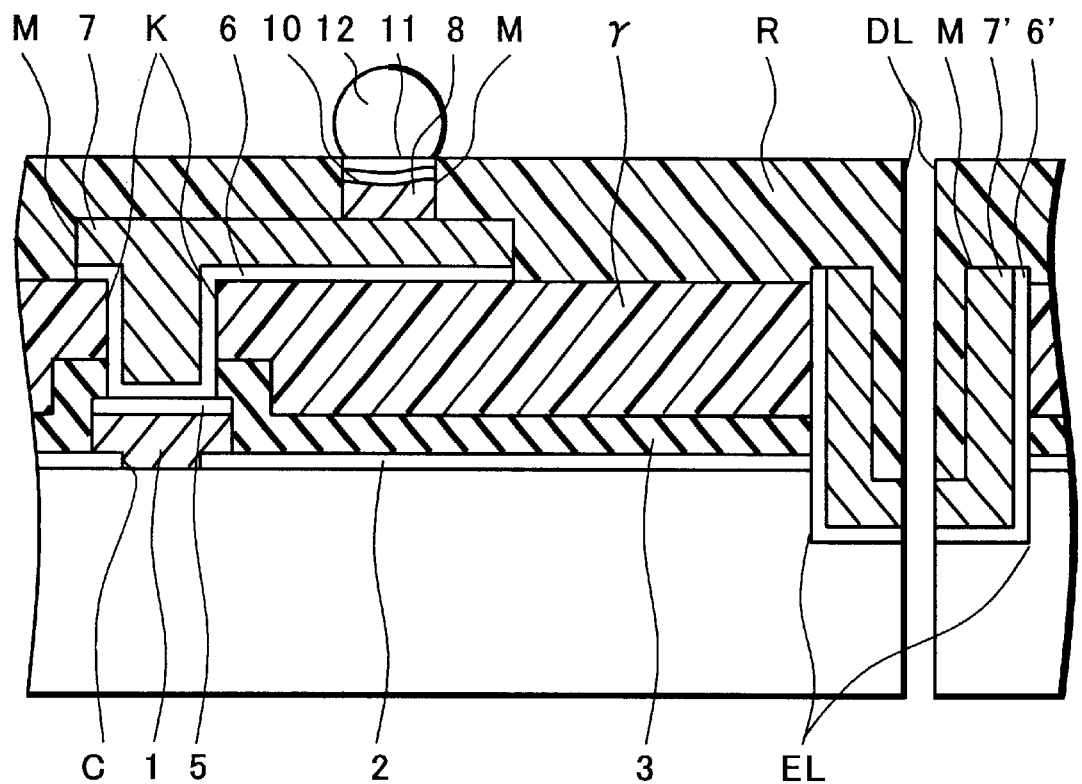
FIG. 5 is a drawing to describe the semiconductor device manufacturing method according to the first embodiment of the invention.

A semiconductor device of the invention is characterized by the fact that in FIG. 5 (FIGS. 1 to 4 are manufacturing process drawings), an insulating resin layer r which becomes a ground of a wiring layer is formed by spinning on a fluid amic acid, and is flattened and cured, then the wiring layer is formed, whereby the heights of metal posts are made uniform. It is also characterized by the fact that a seal material is formed so as to cover at least the interface between each two layers included in the semiconductor substrate and a wiring part covering the surface of the semiconductor substrate on the outer periphery of dicing line DL.

That is, a recess from the surface of the semiconductor device to the semiconductor substrate is made on the outer peripheral surface of the semiconductor device and a seal material is disposed so as to cover the interface between each two layers included in the semiconductor substrate and the wiring part covering the surface of the semiconductor substrate, the interface is exposed in the recess.

Numeral 1 denotes an Al electrode, a portion of the top metal layer (also functioning as a bonding pad) in an IC chip of normal wire bonding type, and numeral 2 denotes an interlayer insulating film in which a contact hole C of the Al electrode 1 is made.

A plurality of metal layers are formed in the lower layer of the contact hole C and are in contact with a transistor (MOS-type or BIP-type transistor), a diffusion area, a polysilicon gate, polysilicon, or the like, for example.

The MOS type is covered in the description of the embodiment, but the invention can also be embodied in the BIP type, needless to say.

The structure generally is an IC called one metal layer, two metal layers, . . .

That is, although not shown, as the metal layers increase like two layer, three layers, . . . the interfaces between the metal layer and insulating layer and between the insulating layer and other insulating layers formed above and below the insulating layer exist in the lower layer the interlayer insulating film and espetially interface between insulator and other insulating layer are exposed to a removal area EL described later.

Further, numeral 3 denotes a passivation film. The passivation film 3 is made of a Si nitride film, an epoxy resin, polyimide, or the like, and an insulating resin layer r is put on the passivation film 3. The insulating resin layer r can be made flat as described later. Thus, rewiring layers 7 scattered in the wafer can be made flat and the heights of the solder balls scattered over the wafer can be made constant.

Particularly, to adopt a shrink resin with a sheet, when a film before curing is pressurized with a press plate (upper metal mold) with a flat surface, the heights of the tops of metal posts 8 are uniform and thus all the metal post heads can be abutted against the pressurization part and the resin on the heads can be eliminated, making it possible to expose metal with high accuracy, as described in detail in process.

A Ti nitride film 5 is formed on the Al electrode 1.

An opening K for exposing the Ti nitride film 5 is made in the passivation film 3 and the insulating resin layer r and here, a thin film layer 6 of Cu is formed as a plate electrode (seed layer) of the rewiring layer 7. The rewiring layer 7 plated with Cu is formed on the Cu thin film layer 6.

A resin layer R made of a resin is formed on the chip full face containing the rewiring layer 7. However, although not shown, a $Si_3N_4$ film may be placed on the interface between the resin layer R and the rewiring layer 7 or the interface between the resin layer R and a metal post 8.

The resin layer R can be made of a thermosetting or thermoplastic resin; particularly an amic acid film or polyimide family or epoxy family resin is preferred as the thermosetting resin. To adopt a thermoplastic resin, thermoplastic polymer (Himal manufactured by Hitachi Kasei), etc., is preferred. The amic acid film has a shrinkage percentage of 30% to 50%.

Resin layer R consisting essentially of a liquid amic acid is provided and is spun on the wafer full face. It is about 20 to 60 µm thick. Then, the resin layer R is polymerized by thermosetting reaction at a temperature of 300° C. or more. However, the resin layer R made of amic acid before being heat-cured becomes active at the temperature and reacts with Cu, worsening the interface. However, the wiring layer surface is covered with a Si3N4 film, whereby the reaction with Cu can be prevented. Here, the Si3N4 film has a thickness of about 1000 to 3000 A.

The Si3N4 film is an insulating film excellent in barrier property and an $SiO_2$ film is inferior to the $Si_3N_4$ film in barrier property. However, to adopt the $SiO_2$ film, it needs to be made thicker than the $Si_3N_4$ film. The $Si_3N_4$ film, which can be formed by a plasma CVD method, is also excellent in step coverage and is preferred. Further, after the metal post 8 is formed, the resin layer R is put. Thus, if the $Si_3N_4$ film is formed, not only the reaction of the rewiring layer 7 made of Cu and the resin layer consisting essentially of amic acid, but also the reaction of the metal post 8 made of Cu and the resin layer R consisting essentially of amic acid can be prevented.

If the resin layer R is in a fluid state before it is cured, it is shrunk during the curing and the film thickness of the resin layer R is decreased drastically. Therefore, the surface of the resin layer R is positioned lower than the head of the metal post 8, exposing the metal post. Therefore, the resin layer R need not be ground for exposing the head of the metal post 8. At the grinding step, uniformly exposing the heads of the metal posts 8 involves very difficult control, but the heads can be exposed easily as the resin is shrunk. However, a thin coat of the resin may remain on the head, in which case it can be removed easily by plasma ashing.

At the step, resin R with a small shrinkage percentage is applied and after it is cured, the resin layer R may be ground to expose the heads of the metal posts 8, of course.

Therefore, the head of the metal post 8 appears at the end part of the rewiring layer 7 and barrier metal can be formed on the head of the metal post B. Particularly, here, Ni 10 and Au 11 are formed by electroless plating.

If a solder ball is formed directly on the metal post 8 made of Cu,. the connection strength to the solder ball is degraded because of oxidized Cu. If Au is directly formed to prevent oxidation, Au is diffused. Thus, Ni is inserted therebetween. Ni prevents oxidation of Cu and Au prevents oxidation of Ni. Therefore, degradation of the solder ball and degradation of the strength are suppressed.

A solder ball 12 is formed on the head of the metal post 8.

Here, the difference between the solder ball and a solder bump will be discussed. As the solder ball, ball-like solder is provided separately and is fixedly secured to the metal post 8. The solder bump is by electrolytic plating via the rewiring layer 7 and the metal post 8. It, is formed as a film having thickness in the beginning and is formed like a ball in a heat treatment.

Since the seed layer is removed after the metal post is formed, electrolytic plating cannot be adopted and in fact, a solder ball is provided.

Last, a removal area denoted by EL is formed surrounding the chips provided in a wafer state, and the interface exposed to the removal area is covered with both or either of the materials of the rewiring layer 7 and the metal post 8.

The removal area EL reaches the semiconductor substrate from the surface of the insulating resin layer r and is formed by dicing in a manufacturing method described later. Therefore, the interface between the interlayer insulating films is exposed to the flank of the removal area EL. The flank to which the interface is exposed is coated with interlayer insulating film or metal, thereby providing moisture sealing; however, considering simplification of the step, on the removal area EL, the wiring layer and the metal posts are also formed at the same step as the rewiring layer and the metal posts in the element forming region.

Considering protection of the IC circuits, all interfaces below the insulating resin layer r need to be sealed. Considering this point, the films above the insulating resin layer r are made coat films, so that complete sealing can be provided.

The flank of the removal area EL may be coated with three materials of the Cu thin film of the seed layer, the rewiring layer, and the metal post in combination.

In FIG. 5, Cu 6' which becomes the seed layer of the rewiring layer and Cu 7' are formed in the removal area EL. The resin layer R is embedded in the recess made of the coat material.

The removal area EL is fully cut by a dicing blade narrower than the width of the removal area EL. That is, the above-mentioned coat material and the resin layer Rare placed at least between the removal area EL arriving at the semiconductor substrate and full cut line DL and can cover the interface end parts of the layers causing humidity resistance to be degraded, making it possible to prevent element degradation.

Figure 8:
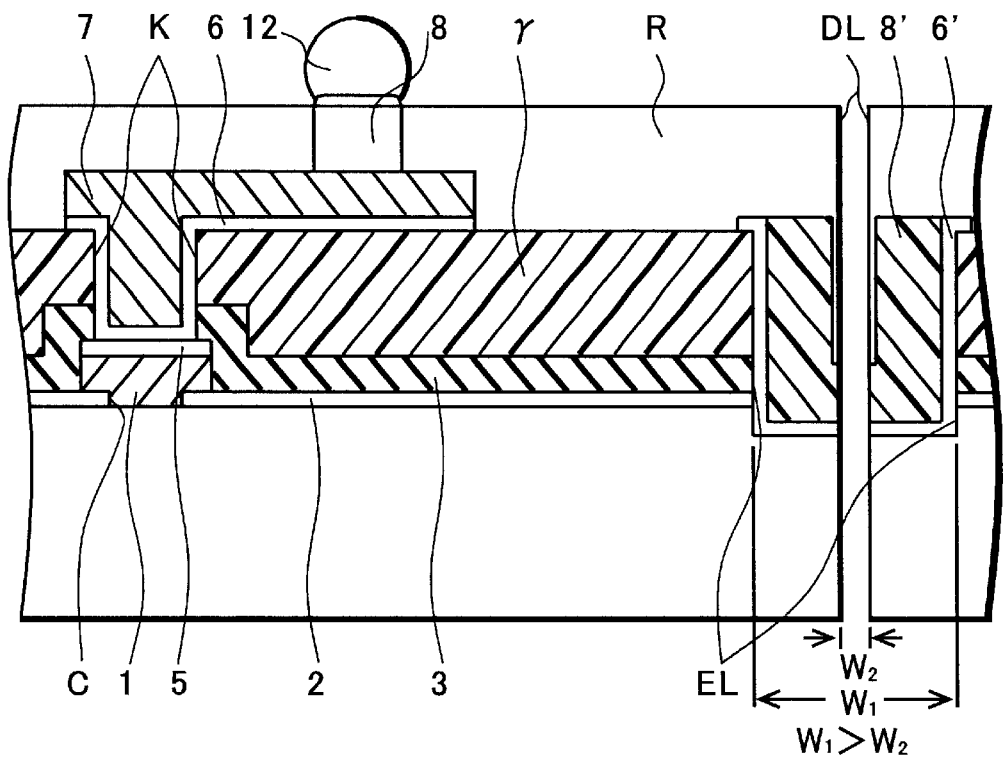
FIG. 8 is a drawing to describe the semiconductor device manufacturing method according to the second embodiment of the invention.
Figure 9:
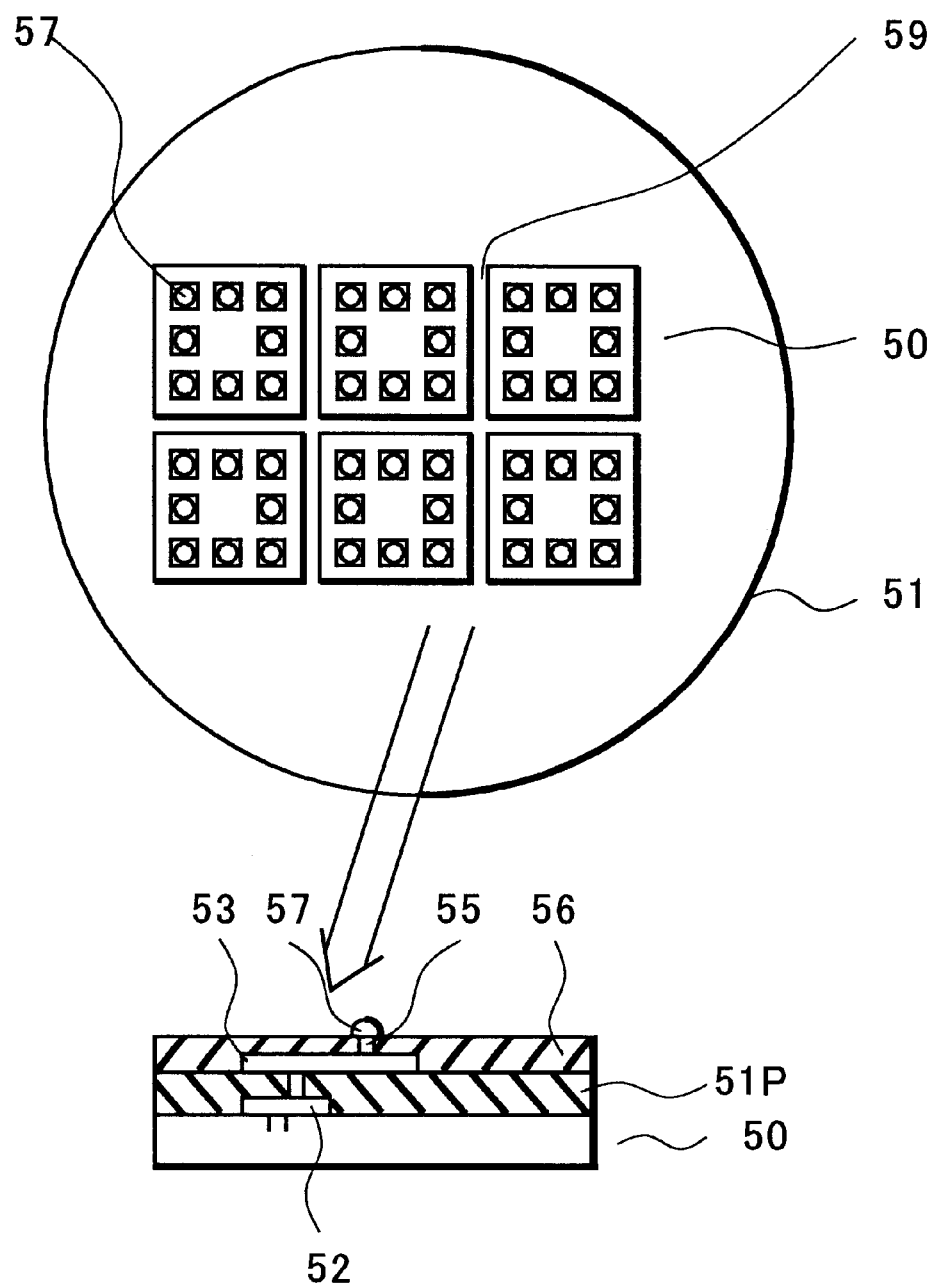
FIG. 9 is a drawing to describe a chip size package in a related art.
Figure 10:
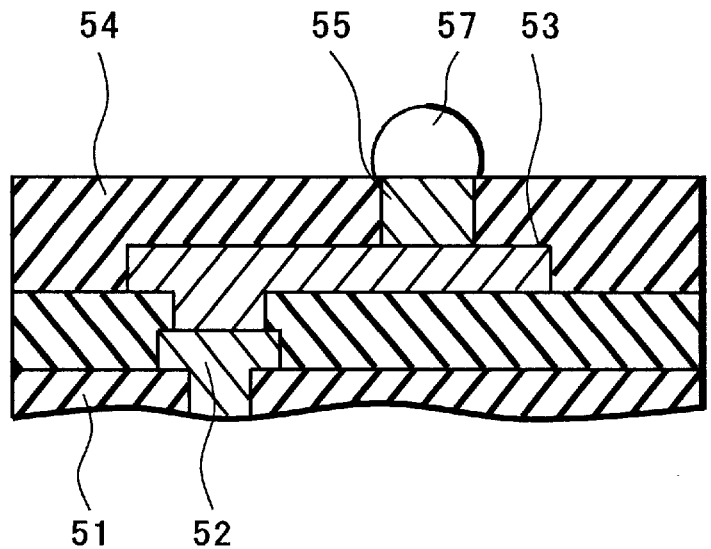
FIG. 10 is a drawing to describe the chip size package in the related art.
Figure 11:
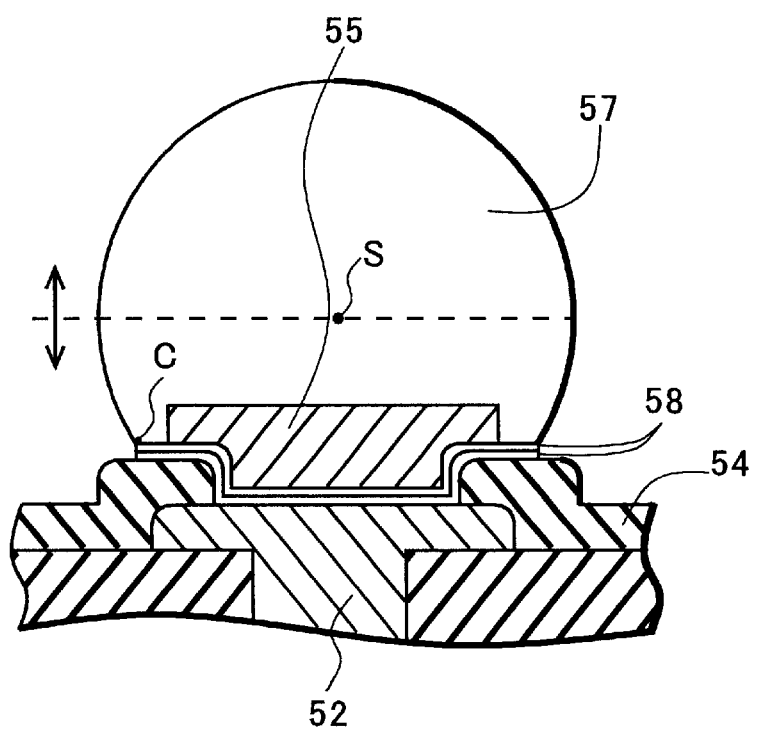
FIG. 11 is a drawing to describe semiconductor device manufacturing method using metal mold.
Figure 12:
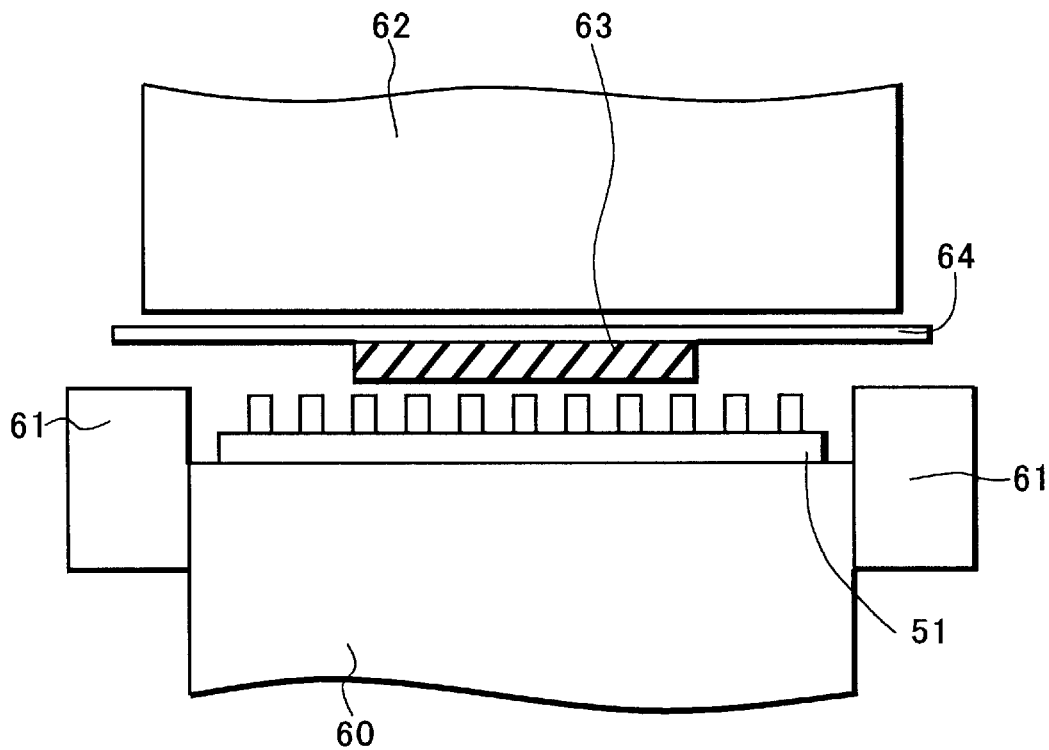
FIG. 12 is a drawing to describe semiconductor device manufacturing method using metal mold.
Figure 13:
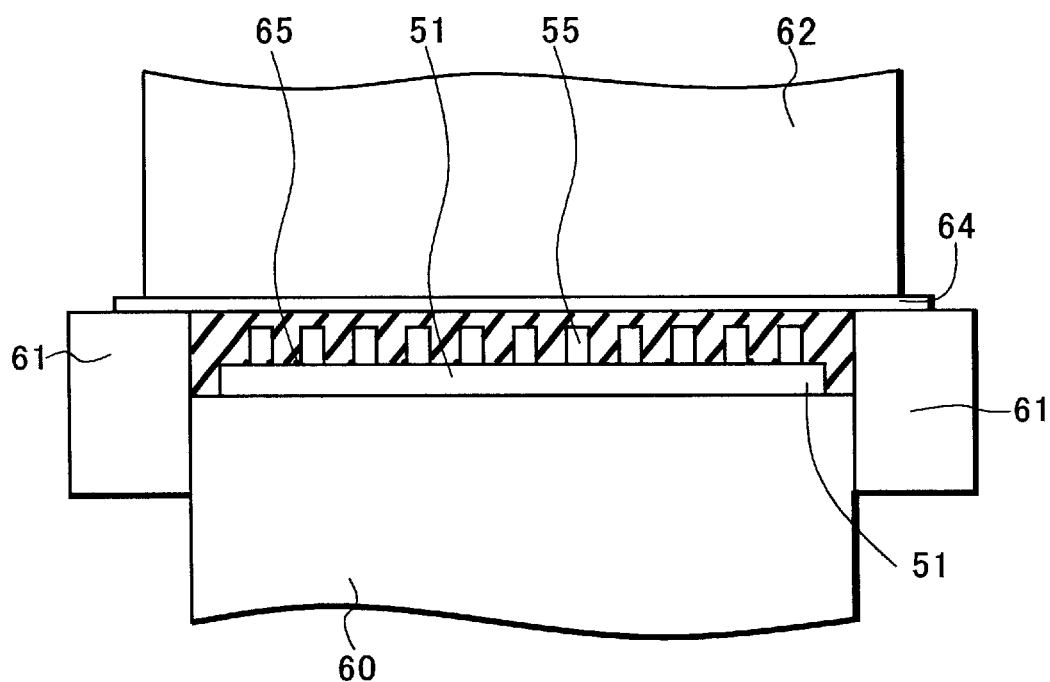
FIG. 13 is a drawing to describe semiconductor device manufacturing method using metal mold.

Generally, a wafer has a thickness of 200 to 300 µm. As described above, the removal area EL may arrive at the semiconductor substrate (Si substrate) from the insulating resin layer in FIG. 5 and considering also the thickness of the wafer, preferably the groove width is about 1 to 100 µm from the Si substrate. In FIG. 8, coats of the Cu seed layer 6' and metal post material 8' are formed, but either of them may be applied.

Figure 1:
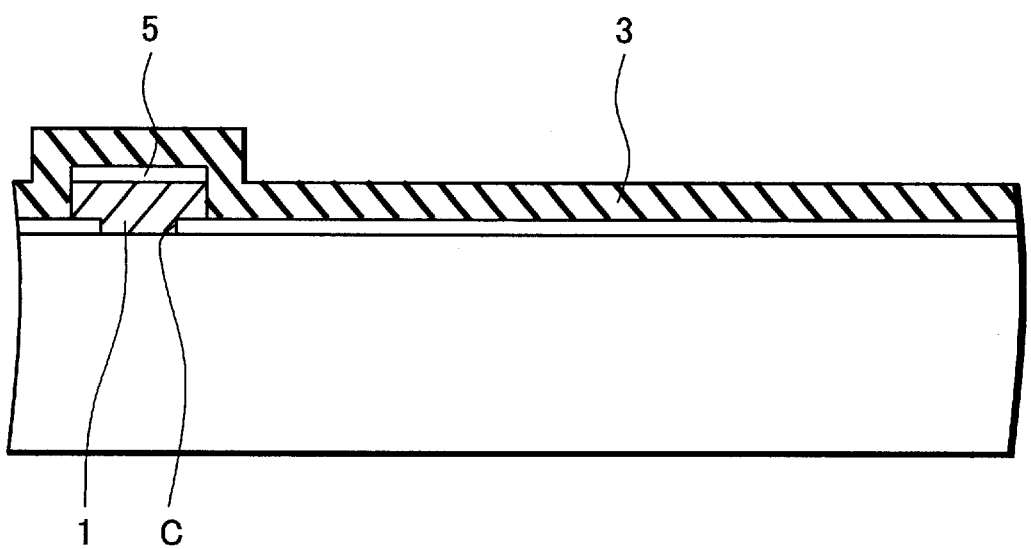
FIG. 1 is a drawing to describe a semiconductor device manufacturing method according to a first embodiment of the invention.

Subsequently, a manufacturing method of the structure in FIG. 5 will be discussed with reference to FIG. 1.

First, a semiconductor substrate (wafer) formed with LSIs each having the Al electrode 1 is provided. Here, as described above, IC comprising one metal layer, two metal layers, . . . is formed with transistor source electrode and drain electrode as the first metal layer and Al electrode 1 in contact with the drain electrode as the second metal layer, for example.

Here, opening C in interlayer insulating film 2 where the drain electrode is exposed is formed, then electrode material consisting mainly of Al, Ti nitride film 5, is formed on the full wafer face and the Al electrode 1 and the Ti nitride film 5 are dry-etched to a predetermined shape with photoresist as a mask.

Here, unlike the case where passivation film 3 is formed and then barrier metal is formed from above the opening C, 15 formation can be executed at a time with the photoresist (also containing the Ti nitride film as barrier metal), making it possible to reduce the number of steps.

The Ti nitride film 5 also functions as barrier metal of Cu thin film layer (seed layer for plating) 6 later formed. Moreover, attention is also focused on the fact that the Ti nitride film is effective as a reflection prevention film. This means that the Ti nitride film is also effective as an antihalation film of a resist used at the patterning time. As antihalation, at least about 1200 A to 1300 A is required; to provide a barrier metal function as well as the antihalation function, about 2000 A to 3000 A is preferred. If the film is formed thicker than the value, a stress is caused by the Ti nitride film.

After the Al electrode 1 and the Ti nitride film 5 are patterned, the full face is covered with passivation film 3. Here, a Si3N4 film is adopted as the passivation film, but polyimide, etc., is also possible. (See FIG. 1) Subsequently, the surface of the passivation film 3 is covered with insulating resin layer r. Here, a positive photosensitive polyimide film is adopted as the insulating resin layer r and is formed about 3 to 5 μm thick. Opening K is made.

Figure 2A:
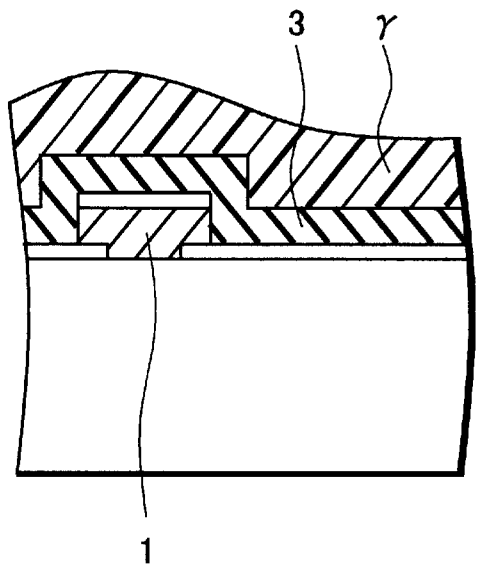
FIG. 2 is a drawing to describe the semiconductor device manufacturing method according to the first embodiment of the invention.
Figure 2B:
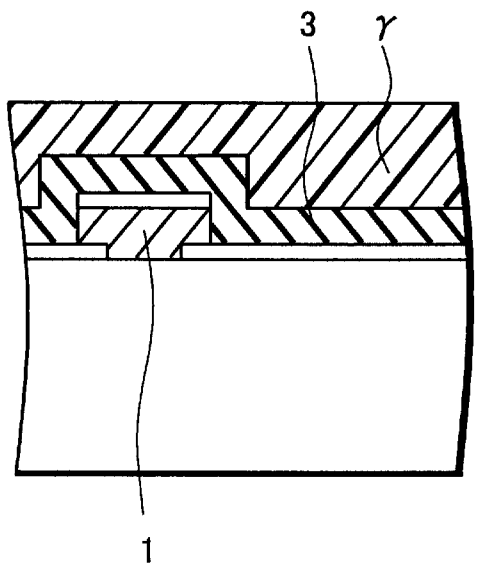
Figure 2C:
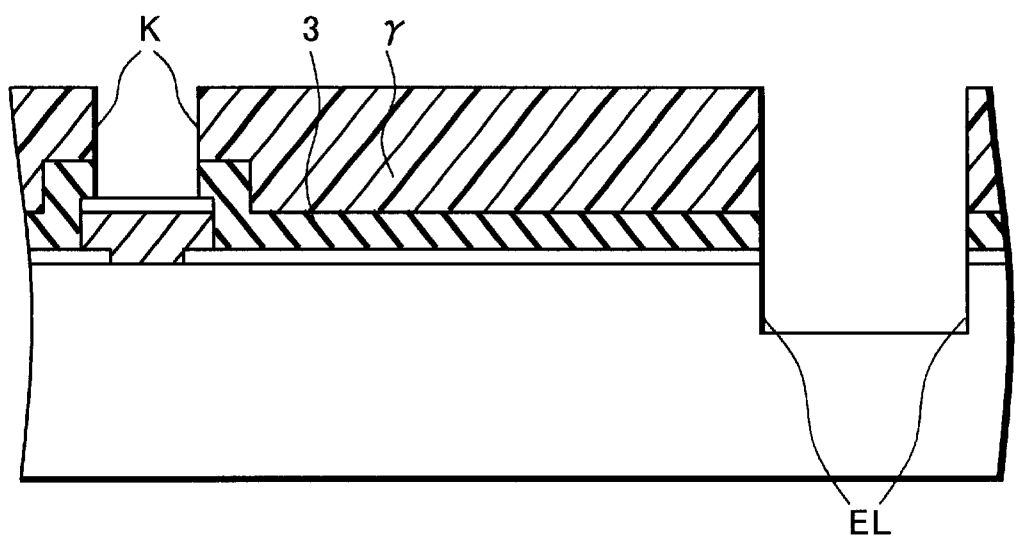

Adopting the photosensitive polyimide film eliminates the need for separately forming photoresist and making the opening K in patterning of the opening K in FIG. 2, and the step can be simplified by adopting a glass photomask, metal mask. Of course, photoresist can also be adopted. Moreover, the polyimide film is also adopted for the purpose of flattening. That is, for the heights of solder balls 12 to be uniform in all regions, the heights of metal posts 8 also need to be uniform in all regions, and rewiring layer 7 also needs to be formed flat with accuracy. Thus, polyimide resin is applied and the resin, which has fluidity having one viscosity, is left standing for any desired time before it is cured, whereby the surface is made flat. FIG. 2A shows a state just after resin layer application, FIG. 2B shows a state in which the resin is made flat after it is left standing, and FIG. 2C shows a state in which the recesses, namely, removal area EL and the opening K for contact are formed by selective etching.

Here, the Al electrode 1 also serves as an external connection pad of the LSI. When formation as a chip size package comprising a solder ball (solder bump) is not executed, the Al electrode 1 functions as a wire bonding pad.

At the same time as the opening K is formed, removal area wider than the dicing width is provided in an area where a dicing line is formed. For example, the insulating resin layer r is photosensitive, first the areas corresponding to the opening K and the removal area EL are removed in the insulating resin layer r and the passivation film 3 and the interlayer insulating film 2 are removed with the insulating resin layer r as a mask. If selective etching is executed, Tin 5 becomes a stopper on the opening K side if the etching depth of the removal area EL is deep.

Here, the interfaces between the interlayer insulating film 2 and the passivation film 3 and between the passivation film 3 and the insulating resin layer r are exposed to the flank of the removal area EL. (See FIGS. 2A to 2C.)

Subsequently, Cu thin film layer 6 is formed on the full face. The Cu thin film layer 6 will become a plate electrode of rewiring layer 7 later; for example, it is formed as a film thickness of about 1000 to 2000 A by sputtering.

Subsequently, for example, a photoresist layer PR1 is applied to the full face, and the photoresist layer PR1 corresponding to the rewiring layer 7 and the removal area EL is removed.

Subsequently, with the Cu thin film layer 6 exposed to the opening of the photoresist PR1 as a plate electrode, the rewiring layer 7 is formed and at the same time, material of the rewiring layer 7 is also formed on the surface of the removal area EL via the seed layer 6'. The rewiring layer 7 needs to be made thick about 2 to 5 μm to provide a mechanical strength. Here, it is formed using a plating method, but may be formed using evaporation, sputtering, etc.

Only the seed layer or the seed layer and the rewiring layer material may be formed on the surface of the removal area EL. (See FIG. 3.)

Then, the photoresist layer PR1 is removed, a photoresist PR2 where an area where metal post 8 is formed is exposed is formed, and the Cu metal post 8 is formed in the exposure area by electrolytic plating. In this case, the Cu thin film layer 6 is also utilized as a plate electrode. The metal post 8 is formed in a height of about 30 to 40 μm.

Here, sputtering is also possible as any other method than electrolytic plating.

In the figure, the portion of the removal area EL is covered with the photoresist PR2, but may also be exposed and material of the metal post 8 may be formed. The metal post material is again embedded in the groove formed of the coat materials 6' and 7' formed in the removal area EL. In dicing in FIG. 5, in FIG. 4, much resin exists and thus the blade is clogged, but if the metal post material is embedded, the amount of the resin layer R is reduced accordingly, so that the life of the blade is prolonged. (See FIG. 4.)

Subsequently, the photoresist PR2 is removed and the Cu thin film layers 6 and. 6' are removed with the rewiring layer 7 and the coat material 7' as masks.

The following step is not shown in the figure; a Si3N4 film may be put on the full surface containing the rewiring layer 7, the metal post 8, and the coat material 7' by the plasma CVD method.

Cu and the pre-cured resin R formed in a later step react with each other by heat. Thus, the interface therebetween is degraded. Therefore, the rewiring layer 7, the metal post 8, and the coat material 7' need to be all covered with the $Si_3N_4$ film. If degradation of the interface does not occur, the $Si_3N_4$ film can be omitted, of course.

If the $Si_3N_4$ film is formed after the metal post 8 is formed, the rewiring layer 7, the metal post 8, and the coat material made of the metal post material can also be covered. Patterned and exposed flank M needs to be protected together; here, both are patterned and then the $Si_3N_4$ film is put, so that the flank M is protected together.

Subsequently, the resin layer R is applied onto the full face.

The resin has fluidity in the beginning and has a film thickness largely decreased upon completion of thermosetting reaction.

The resin, which has fluidity, can provide a flat property before it is cured, and it is positioned below the metal post head because the film thickness of the resin is decreased.

The insulating resin layers R and r also have the following advantages:

Generally, if a viscous resin is applied by a dispenser, bubbles are taken in although deaeration is executed. If sintering is executed with bubbles taken in, the bubbles will burst in a later step or in a high-temperature atmosphere used by the user.

In the process, resin is applied by spin on and the viscosity is adjusted so that the film can be formed as a film thickness of about 20 to 30 μm by one spin. As a result, the bubbles larger than the film thickness are broken and disappear because the film is thin. The bubbles smaller than the film thickness are blown off to the outside together with the resin blown off to the outside by the centrifugal force of the spin on, and a film with no bubbles can be formed.

The insulating resin layer R requires a film thickness of about 50 μm. In this case, the above-described principle is adopted, resin is applied more than once by spin on, and the insulating resin layer R can be formed while bubbles are removed.

Of course, application may be executed using a dispenser or sealing may be executed using a metal mold without adopting spin on.

Further, the insulating resin layer R has the advantage that it is shrunk when it is cured. Generally, a resin is shrunk to some extent after it is cured. However, the insulating resin layer R is shrunk during baking, and the surface of the insulating resin layer R is positioned below the head of the metal post 8. Therefore, the head of the metal post 8 is exposed and thus a solder ball can be fixedly secured.

To enhance the strength of the solder ball, the exposure percentage containing the flanks of the metal post 8 needs to be enlarged; the application amount of the insulating resin layer R is controlled, whereby the exposure percentage can be controlled.

After it is cured, an extremely thin film may remain on the head of the metal post 8, in which case the surface may be ground or plasma-ashed simply. Particularly, as described above, the heights of the metal posts 8 are uniform, thus if a flat grinding plate is used, all heads can be cleaned.

After the insulating resin layer R is put, it may be semi-cured to such an extent that it can be ground, then the insulating layer R may be ground to the proximity of the head of the metal post 8 before it is completely cured. In this case, only an extremely thin film is left on the head of the metal post 8. Thus, if the insulating resin film R has a small shrinkage percentage, the metal post 8 can be exposed as the insulating resin film is shrunk. That is, the film thickness that can be placed on the metal post 8 is determined by the shrinkage percentage of the resin, thus grinding, no grinding, or the degree of grinding if grinding is executed may be determined in accordance with the film thickness, and the metal post 8 may be exposed.

If the $Si_3N_4$ film is formed, the $Si_3N_4$ film is formed on the head of the metal post 8, in which case it is removed by wet etching, dry etching, or grinding.

Further, the exposed top of the metal post 8 is plated with Ni 10 and Au11. Here, the Cu thin film layer 6 is removed with the rewiring layer 7 as a mask, thus electroless plating is adopted for forming Ni 10 about 1 μm thick and Au 11 about 5000 A thick.

If the insulating resin layer is applied up to the upper layer of the top of the metal post 8 and is ground, it is very difficult to expose the head of the metal post 8. Since Au is in the top layer with a film thickness of about 5000 A, if flat grinding is not accomplished, Au appears on one post, the insulating resin layer is put on Au on another post, and Au is shaven on another post. That is, Au also serves as prevention of oxidation, thus a place where a solder ball is fixedly secured, a place where a solder ball is weakly secured, and a place where a solder ball is not secured occur.

In the invention, the metal post 8 is exposed, so that the barrier metals 10 and 11 are formed with high accuracy and the securing of the solder ball 12 also becomes good.

The resin layer R has been described as the shrinkage type, but may be ground as descried above. That is, the metal post 8 may be completely covered with the resin layer R and then may be ground until the metal post 8 is exposed. Also at the grinding step, the resin layer R is embedded in the first groove, thus crack-s, etc., can be prevented.

Although not shown in the figure, the wafer surface is covered with a protective sheet and back grinding is executed for thinning the wafer.

Although not shown in the figure, after the back grinding, the rear face of the wafer may be coated with a resin for preventing a flaw occurring at the back grinding time from causing the wafer to be broken and also preventing shrinkage of the insulating resin layer R from causing the wafer to be warped.

Therefore, the resin layer R largely shrunk exists on the surface and thus a resin layer R having the same level of thickness needs to also be formed on the rear face. The insulating resin layer r is also considered; the thickness of the resin layer formed on the rear surface at least equal to or more than that of the resin layer R or the film thickness of the resin layers R and r at the maximum is required. After it, dicing is executed. Thus, considering protection against breakage of the chips and warp if the chip size is large, protective resin formed on the rear face can also be left as a product.

Last, provided solder balls 12 are registered and mounted, then reflowing is executed. The semiconductor substrate is divided along each scribe line DL in a dicing step to complete chip size packages.

The timing at which the solder is fused is before dicing.

The invention is characterized by the dicing. A dicing blade narrower than the removal area EL is provided and is used to fully cut almost at the center of the removal area EL. The removal area EL is provided by half cutting arriving at the semiconductor substrate, for example. Thus, the interface end parts of the layers formed above the semiconductor substrate are protected by the coat layers 6' and 7' and the resin layer R and become CSP.

The rewiring type has been covered in the description of the invention, but the invention can also be embodied in the resin seal type, needless to say.

In the invention, a film F with a sheet 30 may be adopted as the insulating resin layer 30.

Subsequently, a second embodiment of the invention will be discussed.

Figure 3:
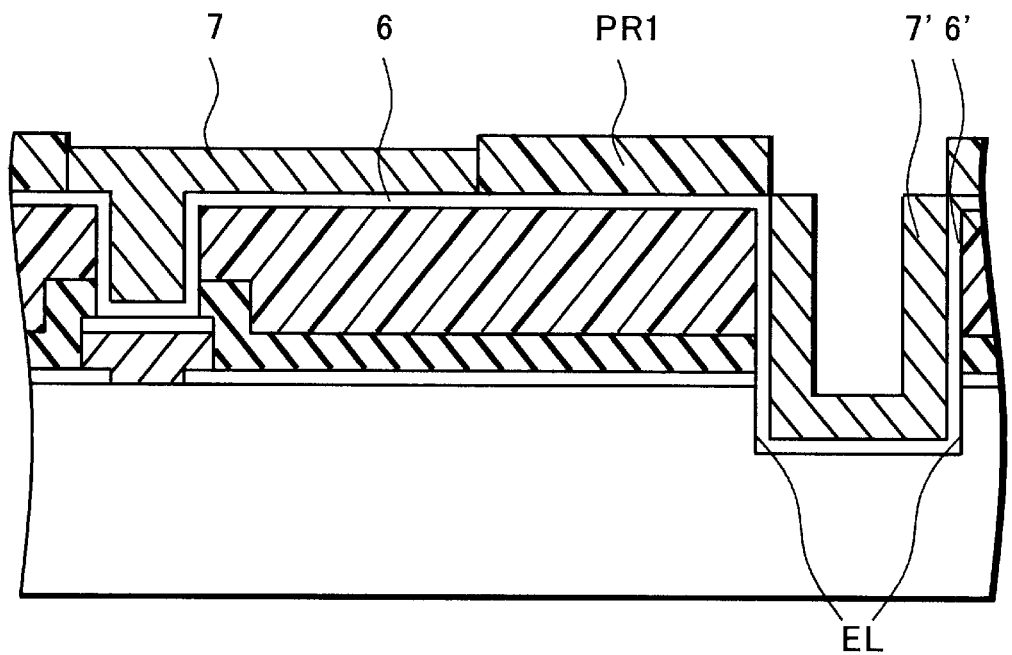
FIG. 3 is a drawing to describe the semiconductor device manufacturing method according to the first embodiment of the invention.
Figure 4:
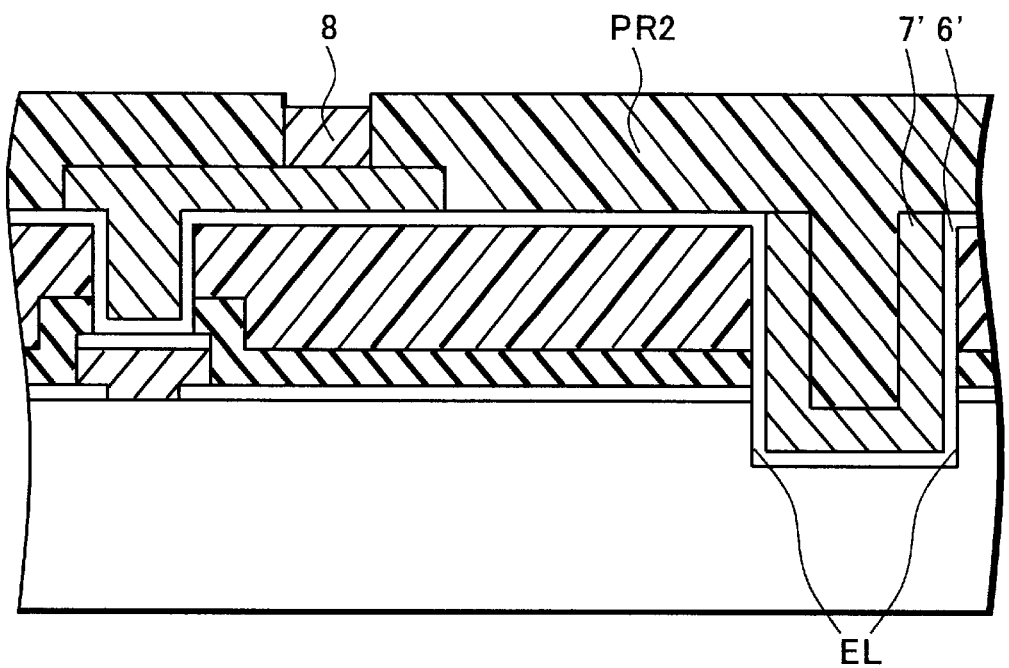
FIG. 4 is a drawing to describe the semiconductor device manufacturing method according to the first embodiment of the invention.

In the second embodiment, a metal post material is used as a coat material. The steps of up to formation of seed layers 6 and 6' in FIG. 3 are similar to those in the first embodiment.

Figure 6:
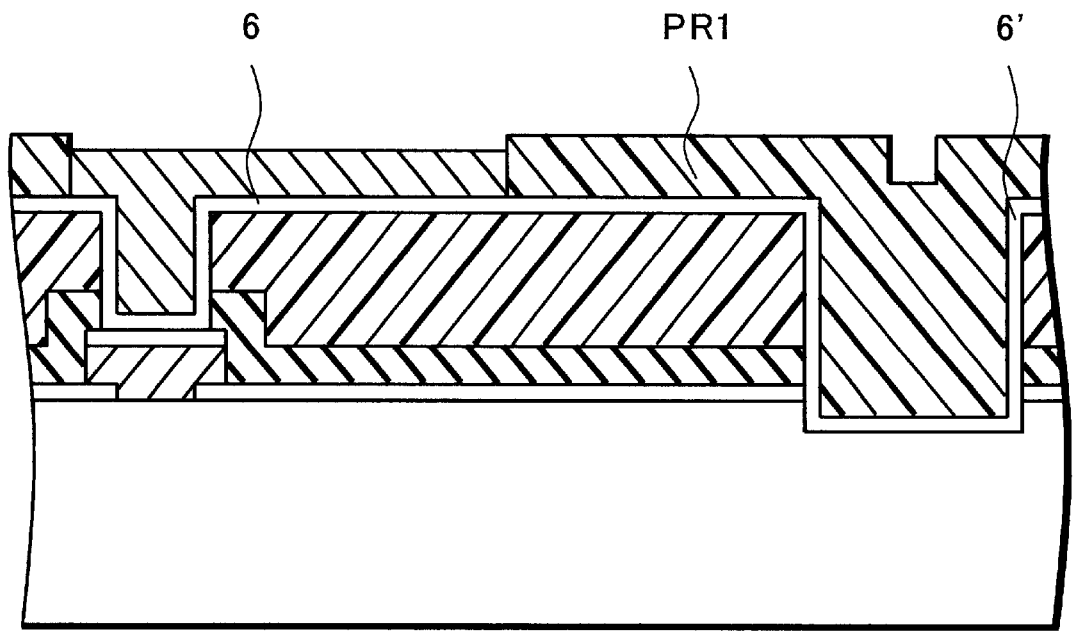
FIG. 6 is a drawing to describe a semiconductor device manufacturing method according to a second embodiment of the invention.

After the seed layers are formed, a photoresist PR1 with the formation area of are wiring layer 7 exposed is formed. Here, a removal area EL is also covered. The rewiring layer 7 is formed via the seed layers 6 and 6'. (See FIG. 6.)

Figure 7:
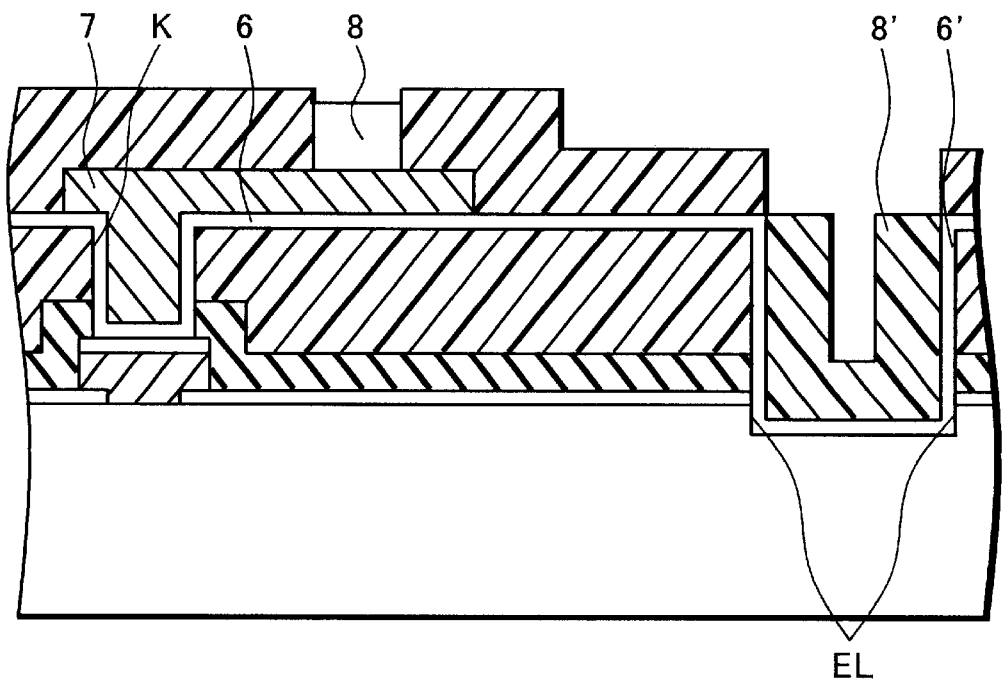
FIG. 7 is a drawing to describe the semiconductor device manufacturing method according to the second embodiment of the invention.

Subsequently, the photoresist PR1 is removed and a photoresist PR2 where the formation area of a metal post 8 and the formation area of the removal area EL are exposed is formed and at the same time, a coat material 8' is formed. (See FIG. 7.)

Further, the photoresist PR2 is removed, a resin layer R is formed, a solder ball 12 is formed, and dicing is executed. (See FIG. 8.) The step is also substantially similar to the step in FIG. 5 and therefore will not be discussed again in detail.

In both the first and second embodiments, the removal area may be formed by dicing or may be provided by etching.

The interface to which the removal area EL is exposed can be covered with the rewiring layer material and the metal post material, so that a seal ring function can be provided. Moreover, unlike the case where a separate seal ring made of electrode in IC formation part is provided, in the invention, the seal ring function is provided on the verge of the dicing area and thus can be realized without upsizing the chip size package.

According to the invention, first a removal area from the surface of each semiconductor chip to the semiconductor substrate is provided on the flank in the surrounding of the semiconductor chip and the interface exposed to the removal area is coated with material used with both or either of the metal post, the rewiring layer and silicon nitride layer, so that the entry passage of moisture causing secular change can be blocked.

Second, the removal area is formed by dicing, whereby the time required for forming the removal area can be shortened drastically.

Third, resin is formed in the removal area and full cutting is executed on the outside from the flank to which the interface is exposed, so that double sealing can be provided.

Further, the Cu plating step is shared, whereby formation can be executed without any additional step. According to the invention, fourth, the first insulating layer abutting the wiring layer is made of a fluid material, the surface of which has substantial flatness after the expiration of a predetermined time after the material is put on the wafer, and after the first insulating layer is flattened, the wiring layer is formed. Thus, if a plurality of metal posts are formed on the semiconductor wafer, the heights from the rear face of the substrate to the metal post heads become all uniform.

The material can be easily formed by spin on without providing additional facilities.

The insulating layer made of the resin is formed by spin on without adopting the metal mold method, thus press hardening becomes unnecessary and wafer cracks can be prevented.

What is claimed is:

1. A semiconductor device of a chip size package (CSP) structure comprising:

a semiconductor substrate;

a wiring part formed on a surface of the semiconductor substrate;

a recess extending from a surface of said semiconductor device to the semiconductor substrate and disposed on the outer peripheral surface of said semiconductor device; and a sealing material disposed over the recess to cover an exposed interface between the semiconductor substrate and the wiring part covering the surface of the semiconductor substrate; wherein a width of the recess is greater than the that of a dicing line, thereby when the semiconductor device is diced at the recess, the interface is protected by the sealing material covering the interface.

2. The semiconductor device as claimed in claim 1 wherein the wiring part has a surface coated with a resin and comprises an outer lead made of a solder ball or a solder bump so as to project from the resin surface and a metal post connected to the outer lead.

3. The semiconductor device as claimed in claim 1 wherein the sealing material is one of wiring materials forming the wiring part.

4. The semiconductor device as claimed in claim 1 wherein the sealing material contains Cu.

5. The semiconductor device as claimed in claim 1 wherein the recess is coated with a resin.

6. The semiconductor device as claimed in claim 1 further comprising:

an insulating resin layer formed as a ground layer of the wiring part and applied as a fluid material, which has a substantially flat surface after left standing.

7. The semiconductor device as claimed in claim 6 wherein the insulating resin layer is a film formed by a spin method.

8. The semiconductor device as claimed in claim 7 wherein the insulating resin layer is formed to a film thickness completely covering a ground layer.

9. The semiconductor device as claimed in claim 8 wherein the ground layer is a passivation film.

* * * * *